United States Patent
Ward et al.

(10) Patent No.: US 8,604,459 B1
(45) Date of Patent: Dec. 10, 2013

(54) ELECTRICAL DEVICES CONTAINING A CARBON NANOTUBE SWITCHING LAYER WITH A PASSIVATION LAYER DISPOSED THEREON AND METHODS FOR PRODUCTION THEREOF

(75) Inventors: Jonathan W. Ward, Fairfax, VA (US); Garo J. Derderian, Manassas, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 13/491,550

(22) Filed: Jun. 7, 2012

Related U.S. Application Data (60) Provisional application No. 61/507,563, filed on Jul. 13, 2011.

(51) Int. Cl.
*H01L 29/06* (2006.01)
(52) U.S. Cl.
USPC .................. 257/9; 257/2; 257/4; 257/E51.04; 438/99; 438/483; 438/931; 977/745
(58) Field of Classification Search
USPC .......... 257/9, 2, 4, E51.04; 438/99, 483, 931; 977/745
See application file for complete search history.

(56) References Cited

U.S. PATENT DOCUMENTS

| | | | |
|---|---|---|---|
| 7,334,395 B2 | 2/2008 | Tweedie et al. | |
| 7,479,654 B2 | 1/2009 | Bertin et al. | |
| 2008/0212361 A1 | 9/2008 | Bertin et al. | |
| 2009/0154218 A1 | 6/2009 | Bertin et al. | |
| 2010/0001267 A1 | 1/2010 | Manning et al. | |
| 2010/0108982 A1* | 5/2010 | Ping et al. ........................ | 257/5 |
| 2011/0095258 A1* | 4/2011 | Xu et al. ........................ | 257/3 |

* cited by examiner

*Primary Examiner* — Tu-Tu Ho
(74) *Attorney, Agent, or Firm* — McDermott Will & Emery LLP (57) ABSTRACT

Electrical devices containing carbon nanotubes can be passivated to protect the carbon nanotubes from degradation while substantially preserving the carbon nanotubes' electrical conductivity and switching characteristics. Such electrical devices can include a first metal contact, a switching layer containing a plurality of carbon nanotubes disposed on the first metal contact, a passivation layer containing amorphous carbon, a metal carbide, or any combination thereof that is disposed on at least a top surface of the switching layer, and a second metal contact disposed upon the passivation layer. Methods for forming the electrical devices can include disposing a passivation layer containing amorphous carbon on at least a top surface of the switching layer, and optionally heating to at least partially convert the amorphous carbon within the passivation layer into a metal carbide.

15 Claims, 9 Drawing Sheets

ELECTRICAL DEVICES CONTAINING A CARBON NANOTUBE SWITCHING LAYER WITH A PASSIVATION LAYER DISPOSED THEREON AND METHODS FOR PRODUCTION THEREOF

CROSS-REFERENCE TO RELATED APPLICATIONS

This application claims the benefit of priority under 35 U.S.C. §119 from U.S. Provisional Patent Application 61/507,563, filed Jul. 13, 2011, which is incorporated herein by reference in its entirety.

STATEMENT REGARDING FEDERALLY SPONSORED RESEARCH OR DEVELOPMENT

Not applicable.

FIELD OF THE INVENTION

The present invention generally relates to carbon nanotubes, and, more particularly, to electrical devices containing carbon nanotubes.

BACKGROUND

Carbon nanotubes (CNTs) have been proposed for numerous applications due to their excellent electrical conductivity values and high mechanical strength. In the realm of electrical devices, carbon nanotubes can be of particular interest due to their ability to display non-volatile memory effects. That is, carbon nanotubes can be cycled between high and low electrical conductivity states though application of voltage pulses having a sufficient magnitude, such that the attained conductivity state is maintained once the voltage pulse ceases. Maintenance of the attained conductivity state allows the carbon nanotubes to function as a memory when in an electrical device, where a high conductivity state of the carbon nanotubes represents an ON state and a low conductivity state of the carbon nanotubes represents an OFF state.

Vertical orientations of electrical devices are highly desirable in the electronics industry, since vertical orientations can allow a higher density of electrical devices to be packed per unit area compared to a horizontal orientation. In addition, vertical orientations can more readily facilitate the construction of crossbar electrical device arrays. Vertical design strategies are compatible with deposition and patterning techniques that are commonly used throughout the modern electronics industry. Although these techniques can be successfully used for many types of electrical devices, they can be somewhat incompatible with carbon nanotubes. Specifically, many commonly used deposition and patterning techniques, particularly metal deposition techniques, can damage the structure of carbon nanotubes, thereby increasing their switching voltages and reducing their ability to switch. In addition, there can be an increased incidence of electrical shorting due to unwanted metal-to-metal contact when carbon nanotubes are used in electrical devices due to metal filament formation through the carbon nanotubes. As a result, fabrication of vertically oriented electrical devices containing carbon nanotubes can be problematic, both in terms of reliability and achieving desired device characteristics.

In view of the foregoing, techniques that allow carbon nanotubes to be passivated while maintaining their favorable electrical properties, particularly when disposed in vertically oriented electrical devices, would be of considerable benefit in the art. Electrical devices manufactured using these techniques would represent a significant advance in the electronics industry. The present disclosure satisfies the foregoing needs and provides related advantages as well.

SUMMARY

In some embodiments, electrical devices described herein can contain a first metal contact and a second metal contact, a switching layer containing a plurality of carbon nanotubes that is disposed between the first metal contact and the second metal contact, and a passivation layer containing carbon that is disposed on the switching layer.

In some embodiments, electrical devices described herein can contain a first metal contact; a switching layer containing a plurality of carbon nanotubes disposed on the first metal contact; a passivation layer containing amorphous carbon, a metal carbide, or any combination thereof disposed on at least a top surface of the switching layer; and a second metal contact disposed on the passivation layer.

In some embodiments, methods described herein can include forming a first metal contact in union with a dielectric substrate, disposing a switching layer containing a plurality of carbon nanotubes on the first metal contact, disposing a passivation layer containing amorphous carbon on at least a top surface of the switching layer, and forming a second metal contact on the passivation layer, thereby producing an electrical device.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

The present disclosure is directed, in part, to electrical devices containing carbon nanotubes. The present disclosure is also directed, in part, to methods for making electrical devices containing carbon nanotubes.

Figure 1:
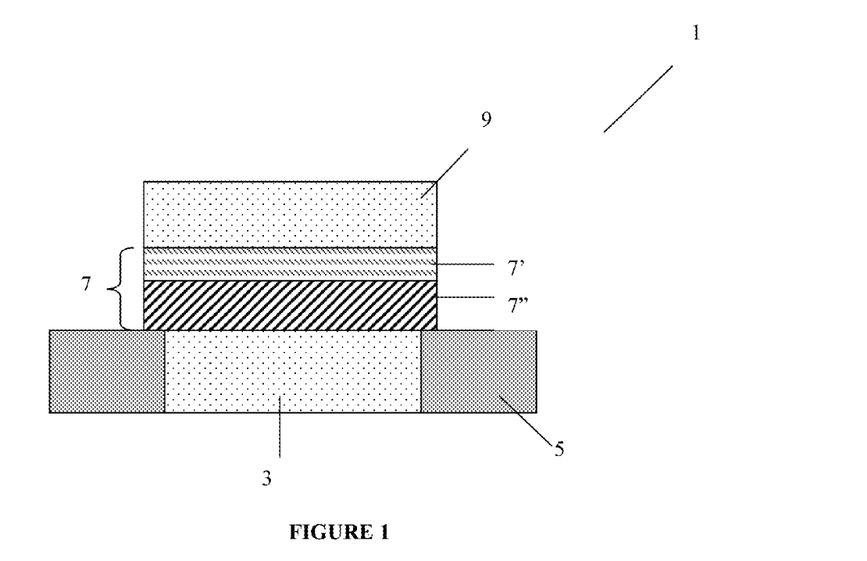
FIG. 1 shows a side view schematic of an illustrative electrical device containing a carbon nanotube layer in which portions of the carbon nanotube layer have been damaged.

As described above, there can be significant issues encountered when incorporating carbon nanotubes within electrical devices, particularly vertically oriented electrical devices, when using conventional fabrication techniques. For example, damage to the structure of carbon nanotubes can occur when an upper metal contact is disposed by sputtering techniques, as is commonly performed in the electronics industry. Some portions of the carbon nanotubes within the electrical device can become damaged by the upper metal contact deposition process, while other portions can remain undamaged. FIG. 1 shows a side view schematic of an illustrative electrical device containing a carbon nanotube layer in which portions of the carbon nanotube layer have been damaged. As shown in FIG. 1, electrical device 1 contains bottom metal contact 3 disposed within dielectric substrate 5. Carbon nanotube layer 7 is disposed between bottom metal contact 3 and top metal contact 9. Carbon nanotube layer 7 contains damaged region 7' nearer top metal contact 9 and undamaged region 7" nearer bottom metal contact 3. Carbon nanotube damage is generally greater nearer to top metal contact 9, since sputter deposition of the metal is believed to produce the damage. Carbon nanotubes within damaged region 7' can undesirably have increased electrical resistance values, in addition to displaying other electrical property differences from the carbon nanotubes in undamaged region 7". Carbon nanotube layer 7 can be toggled between a high resistance OFF state and a lower resistance ON state through application of voltage pulses of sufficient magnitude thereto.

In addition to the issues presented by carbon nanotube damage, a sputter-disposed upper metal contact can bridge through discontinuities in a carbon nanotube layer through metal filament formation. Metal filament formation can bring the upper metal contact into electrical communication with the lower metal contact and result in electrical shorting. Even an exceedingly low incidence of shorting is believed to be unsuitable for the electronics industry.

To mitigate both of the foregoing issues associated with fabricating vertically oriented electrical devices containing carbon nanotubes, a conventional approach has been to increase the thickness of the carbon nanotube layer. However, as the thickness of the carbon nanotube layer increases, its resistance and switching voltage can also increase, thereby reducing the desirable features of electrical devices formed in this manner. Without being bound by theory or mechanism, it is believed that the increase in resistance and switching voltage is related to the increased conduction length between the bottom metal contact and the top metal contact. Although sputter deposition techniques can be modified to reduce their power, they often have a lower power limit that still can result in significant damage to carbon nanotubes. Further, a reduction in sputter deposition power can undesirably result in slow deposition rates and poor deposition uniformity of the upper metal contact.

In view of the foregoing difficulties in the art, we have developed and applied passivation strategies for carbon nanotubes that are compatible with the deposition and patterning techniques commonly used in the electronics industry, particularly sputter deposition of a metal and reactive ion etching (RIE) techniques. More specifically, we have determined that a thin passivation layer containing carbon can be disposed on carbon nanotubes to at least partially protect them from damage during electrical device fabrication, while still allowing the carbon nanotubes' desirable electrical conductivity and non-volatile switching characteristics to be expressed. Amorphous carbon, metal carbides, and several other carbon materials can be suitable for use in the passivation layers described herein. The passivation layers described herein are sufficiently thin that they do not detrimentally increase the electrical resistance of the devices and still maintain electrical conduction between the upper and lower metal contacts, but they are sufficiently thick to protect the carbon nanotubes from damage and significantly reduce the risk of electrical shorting. Thus, the passivation layers described herein do not detrimentally impact the switching behavior of the electrical devices.

In addition to the foregoing advantages, use of a passivation layer containing carbon can allow electrical devices to be fabricated with a thinner carbon nanotube layer, since the risk of carbon nanotube damage is significantly reduced and a thicker layer of carbon nanotubes is not needed to compensate for damaged carbon nanotubes. Use of a thinner carbon nanotube layer can desirably reduce the electrical resistance of the devices compared to like devices having a thicker carbon nanotube layer. Although use of a thinner carbon nanotube layer in an electrical device would ordinarily result in an increased incidence of shorting, the passivation layer can also desirably improve device reliability by reducing the likelihood of metal bridging between the top and bottom metal contacts. In addition, use of the passivation layers described herein can facilitate other aspects of electrical device manufacture, including dielectric layer depositions, planarization, etching, and the like, many of which also can potentially damage carbon nanotubes. Furthermore, use of the passivation layer can reduce the incidence of metal diffusion along the sidewalls of the carbon nanotubes due to Joule heating. Such metal diffusion can lead to eventual failure of the electrical devices.

It should be noted that the passivation layers described herein can also have a switching voltage associated therewith, and the layer thickness again can impact the switching voltage. At typical passivation layer thicknesses, the switching voltages for many carbon materials, including amorphous carbon and metal carbides, are usually significantly higher than that of the carbon nanotubes in the switching layer, such that the passivation layer remains in a continual OFF state during routine operation of the electrical devices. However, switching of the passivation layer can be possible in certain instances, particularly for thin passivation layers. In such cases, multi-level memory states can result, which can be desirable for certain applications.

As used herein, the term "continuous" refers to a layer that contains at least some of the material forming the layer at all points in a region defined by the layer. That is, a "continuous" layer does not have a discontinuity located within the region defined by the layer where there is no layer material about the layer thickness.

As used herein, the term "passivation layer" refers to a layer that is capable of at least partially isolating carbon nanotubes from their surrounding environment and protecting the carbon nanotubes from damaging conditions therein.

As used herein, the term "damage" refers to molecular defects that are introduced in the structure of carbon nanotubes following their synthesis. As used herein, the term "substantially undamaged" refers to carbon nanotubes that have no more or only slightly more molecular defects therein, after exposure to conditions that are capable of damaging carbon nanotubes, than do as-synthesized carbon nanotubes, such that their properties are substantially the same as as-synthesized carbon nanotubes.

As used herein, the term "patterning" refers to removal of at least a portion of a layer following its deposition, thereby forming a structure from the remaining portion of the layer.

As used herein, the term "in union with" refers to touching.

The terms "disposed," "deposited," and grammatical equivalents thereof will be used synonymously herein.

Figure 2:
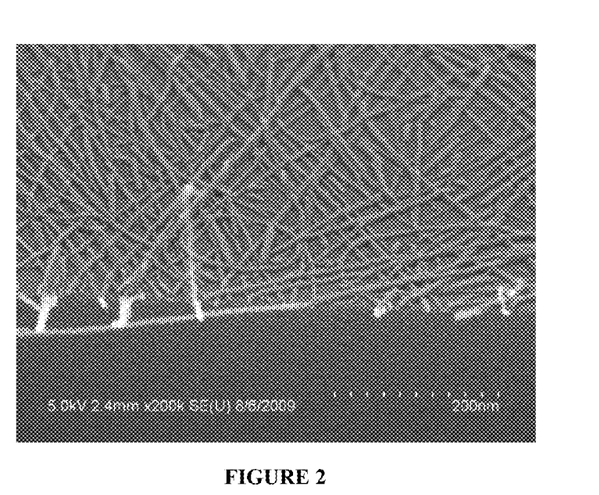
FIG. 2 shows an SEM image of an illustrative nanotube layer following deposition of amorphous carbon.

In some embodiments, electrical devices described herein can contain a first metal contact and a second metal contact, a switching layer containing a plurality of carbon nanotubes disposed between the first metal contact and the second metal contact, and a passivation layer containing carbon that is disposed on the switching layer. FIG. 2 shows an SEM image of an illustrative carbon nanotube layer following deposition of amorphous carbon. As shown in FIG. 2, "dangling" carbon nanotubes are present, thus indicating that the carbon nanotube layer is substantially undamaged by the carbon deposition process. Dangling carbon nanotubes can provide a qualitative measure of carbon nanotube damage. Damaged carbon nanotubes can give rise to brittle fracture characteristics when cleaving. For non-damaged carbon nanotubes, the carbon nanotubes may extend beyond the cleavage surface without any noticeable damage. Other indications of damage to carbon nanotubes can be observed when the carbon nanotubes appear discontinuous. Quantitative analysis of the damage can be further performed by testing of a device's resistance change or switching voltage, for example.

Figure 3:
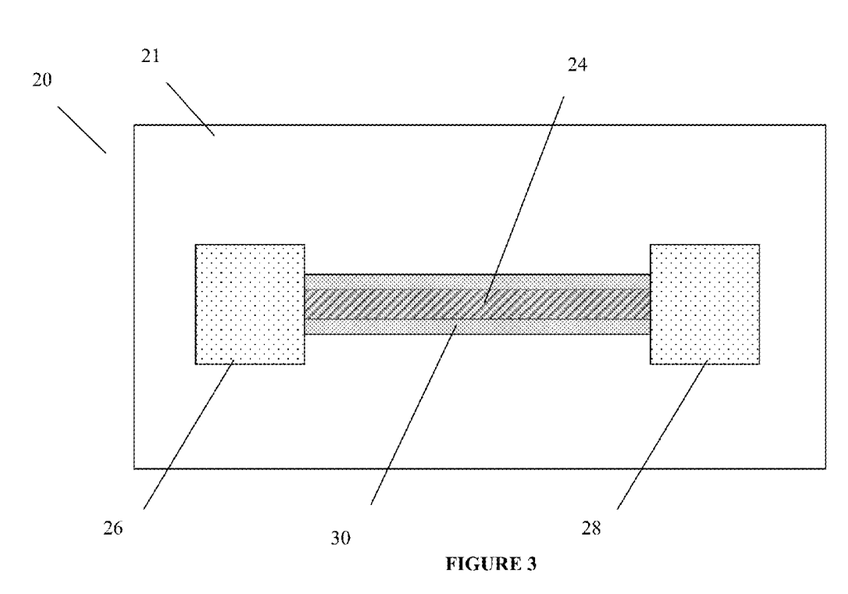
FIG. 3 shows a top view schematic of an illustrative electrical device of the present disclosure configured in a horizontal orientation.

In some embodiments, the electrical devices disclosed herein can be fabricated in a horizontal orientation with the switching layer electrically connecting the first metal contact and the second metal contact and the passivation layer overcoating the switching layer. That is, in such embodiments, the switching layer may be in union with both the first metal contact and the second metal contact. FIG. 3 shows a top view schematic of an illustrative electrical device of the present disclosure configured in a horizontal orientation. As shown in FIG. 3, device 20 is constructed on substrate 21. In some embodiments, substrate 21 can include a dielectric material such as, for example, silicon oxide. Switching layer 24 containing carbon nanotubes forms an electrical connection between first metal contact 26 and second metal contact 28. Passivation layer 30, which contains carbon, overcoats switching layer 24. Suitable types of carbon for inclusion in passivation layer 30 are considered in more detail below. In FIG. 3, passivation layer 30 has been depicted as being partially transparent so that switching layer 24 can be seen below. However, it is to be recognized that passivation layer 30 wholly overcoats switching layer 24. Furthermore, passivation layer 30 has been depicted in FIG. 3 as at least partially extending on to substrate 21. However, passivation layer 30 may only overcoat the top surface of switching layer 24 in some embodiments. In other embodiments, passivation layer 30 may overcoat both the top surface and sides of switching layer 24. Although the horizontal electrical device orientation presented in FIG. 3 falls within the scope of the present disclosure, one of ordinary skill in the art will recognize that the benefits of the passivation layers described herein can be better realized with vertical electrical device orientations, which are described hereinafter.

Figure 4A:
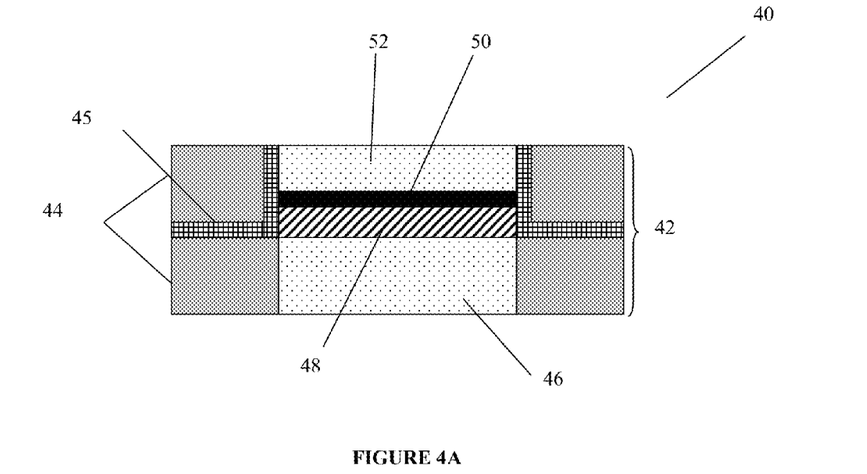
FIGS. 4A and 4B show side view schematics of illustrative electrical devices of the present disclosure configured in a vertical orientation.
Figure 4B:
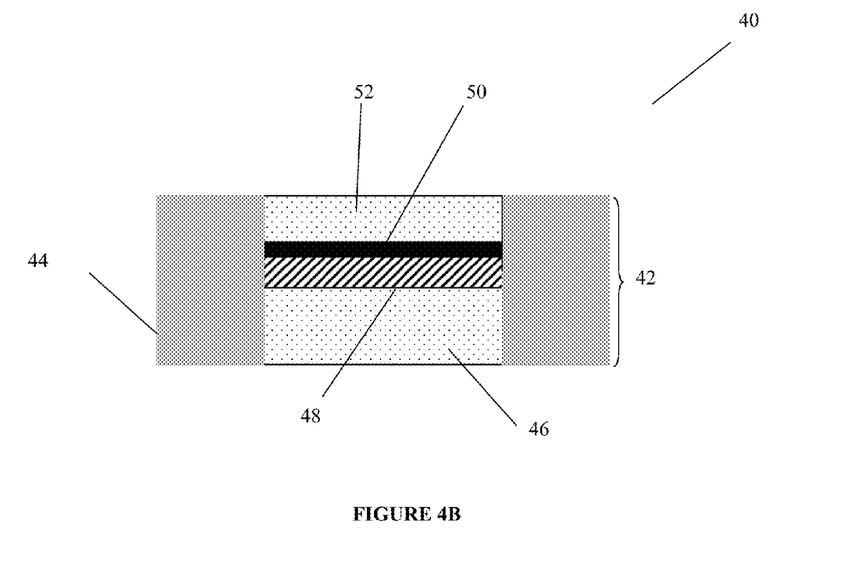

In some embodiments, the electrical devices disclosed herein can be constructed in a vertical orientation with the switching layer being disposed on the first metal contact and the passivation layer being disposed between the switching layer and the second metal contact. As discussed above, vertical orientations of the electrical devices present several advantages from a manufacturing standpoint. Further, vertical orientations can better allow the benefits of the passivation layer to be realized. FIG. 4A shows a side view schematic of an illustrative electrical device of the present disclosure configured in a vertical orientation. As shown in FIG. 4A, device 40 can be buried in dielectric substrate 42, which can include one or more dielectric materials. As depicted in FIG. 4A, dielectric substrate 42 can include first dielectric material 44 and optional second dielectric material 45. For example, in some embodiments, first dielectric material 44 can include silicon dioxide and second dielectric material 45 can include silicon nitride or $SiN_xO_y$, for example. Second dielectric material 45 can serve as a passivation layer upon which additional quantities of first dielectric material 44 can be deposited, or it can serve as an etch stop, for example. FIG. 4B shows the electrical device of FIG. 4A with the second dielectric material omitted. Electrical device 40 includes first metal contact 46, which is disposed in dielectric substrate 42. Switching layer 48, which contains carbon nanotubes, is disposed on first metal contact 46. Passivation layer 50, which contains carbon, is disposed on switching layer 48, and second metal contact 52 is disposed on passivation layer 50. As depicted in FIGS. 4A and 4B, switching layer 48, passivation layer 50, and second metal contact 52 are also disposed in dielectric substrate 42.

Figure 5:
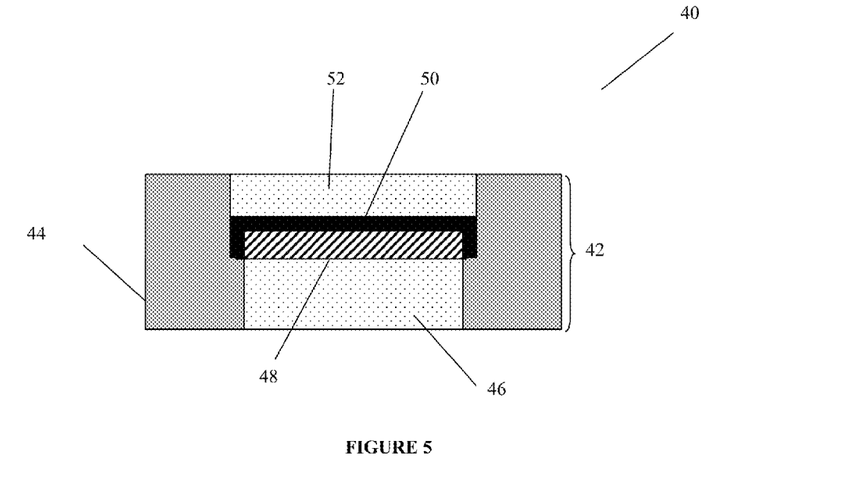
FIG. 5 shows a side view schematic of an illustrative electrical device of the present disclosure configured in a vertical orientation in which the passivation layer also overcoats the sides of the switching layer.

In FIGS. 4A and 4B, passivation layer 50 has been depicted as only being disposed on the top surface of switching layer 48. However, it is to be recognized that passivation layer 50 can overcoat both the top surface and sides of switching layer 48, in some embodiments. FIG. 5 shows a side view schematic of an illustrative electrical device of the present disclosure configured in a vertical orientation in which the passivation layer also overcoats the sides of the switching layer. Reference characters in FIG. 5 are the same as those of FIGS. 4A and 4B and will not be described in detail again.

In some embodiments, electrical devices described herein can contain a first metal contact; a switching layer containing a plurality of carbon nanotubes disposed on the first metal contact; a passivation layer containing amorphous carbon, a metal carbide, or any combination thereof disposed on at least a top surface of the switching layer; and a second metal contact disposed on the passivation layer.

In some embodiments, the electrical devices described herein can be constructed with the first metal contact, the switching layer, the passivation layer, and the second metal contact all being disposed in a dielectric material (see FIGS. 4A, 4B, and 5). In such embodiments, electrical connections can be made to the first and second metal contacts, and the remaining layers can be isolated from their surrounding environment. For example, in some embodiments, electronic components such as resistors, diodes, transistors, capacitors, inductors, antennas, and the like can be electrically connected to at least one of the electrical connections. Further, a switching voltage can be applied to the switching layer via the metal contacts. Electrical devices in which all layers are disposed in a dielectric material can be particularly advantageous for use in constructing electrical device arrays, which will be described in more detail hereinafter. In alternative embodiments, the electrical devices described herein can be constructed with the first metal contact being disposed in a dielectric material, with one or more of the remaining layers being disposed on the first metal contact and above the top surface of the dielectric material. In still other alternative embodiments, the electrical devices described herein can be constructed with the first metal contact being disposed on the surface of a dielectric material and the remaining layers also being located above the top surface of the dielectric material.

In various embodiments, the passivation layer of the electrical devices described herein contain carbon in a suitable form. Suitable forms of carbon for inclusion in the passivation layer can include, for example, amorphous carbon, crystalline carbon, semi-crystalline carbon, metal carbides, non-metal carbides, diamond, diamond-like carbon, graphite, and graphene. In various embodiments, the carbon form can have a switching voltage that is higher than that of carbon nanotubes. Below the switching voltage, the carbon form may be substantially non-conductive or only have a low level of electrical conductivity. In some embodiments, the carbon form can be doped so as to increase its electrical conductivity (e.g., doped diamond and doped diamond-like carbon). In some embodiments, the carbon form may be functionalized, which may increase or decrease the electrical conductivity as needed. In various embodiments, the passivation layer can lack carbon nanotubes. In some embodiments, the passivation layer can contain amorphous carbon. In some embodiments, the passivation layer can contain a metal carbide. In some embodiments, the passivation layer can be chemically reacted with the second metal contact in order to produce the metal carbide. That is, in such embodiments, the passivation layer can form an integral portion of the second metal contact.

As noted above, the use of thinner switching layers can desirably lower resistance in the electrical devices described herein. In various embodiments, the combined thickness of the switching layer and the passivation layer can be varied to produce a desired electrical resistance of the electrical devices. Furthermore, the thickness of each layer can be varied individually to produce a desired switching voltage therein. In some embodiments, the thicknesses can be such that the switching layer has a lower switching voltage than does the passivation layer. In some embodiments, the thicknesses can be such that the switching layer and the passivation layer have substantially the same switching voltage. When the switching layer and the passivation layer have substantially the same switching voltage, the electrical devices can have multiple ON/OFF states. That is, in such embodiments, the devices can have multi-level memory states.

In various embodiments, the switching layer can have an ON switching voltage magnitude ranging between about 1 V and about 10 V. In some embodiments, the switching layer can have an ON switching voltage magnitude ranging between about 1 V and about 8 V, or between about 1 V and about 6 V, or between about 1 V and about 4 V, or between about 1 V and about 2 V. The switching voltage can be either positive or negative in magnitude.

In various embodiments, the passivation layer can have an ON switching voltage magnitude of about 10 V or greater. In some embodiments, the passivation layer can have an ON switching voltage magnitude of about 15 V or greater, or about 20 V or greater. In some embodiments, the passivation layer can have an ON switching voltage magnitude ranging between about 10 V and about 25 V. In some embodiments, the passivation layer can have an ON switching voltage magnitude ranging between about 15 V and about 25 V, or between about 15 V and about 20 V. In some embodiments, the passivation layer can have an ON switching voltage magnitude that is at least about two times that of the switching layer. In some embodiments, the passivation layer can have an ON switching voltage magnitude that is at least about three times that of the switching layer. In some embodiments, the passivation layer can have an ON a switching voltage magnitude that is at least about four times that of the switching layer. In some embodiments, the passivation layer can have an ON switching voltage magnitude that is at least about five times that of the switching layer. Again, the switching voltage can be either positive or negative in magnitude.

In various embodiments, the passivation layer can have a thickness ranging between about 1 Å and about 100 Å. In some embodiments, the passivation layer can have a thickness ranging between about 5 Å and about 50 Å, or between about 10 Å and about 50 Å, or between about 10 Å and about 40 Å, or between about 10 Å and about 30 Å, or between about 20 Å and about 40 Å, or between about 20 Å and about 30 Å, or between about 15 Å and about 45 Å, or between about 15 Å and about 30 Å.

Figure 6A:
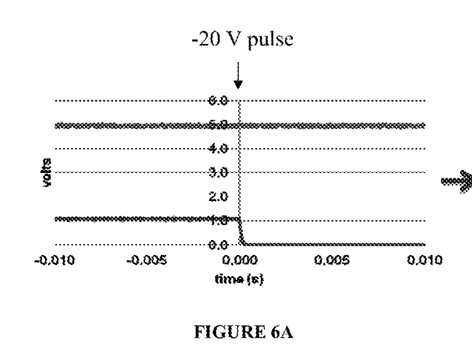
FIGS. 6A and 6B show illustrative plots of the switching behavior of a layer of amorphous carbon having a thickness of about 20-30 Å.
Figure 6B:
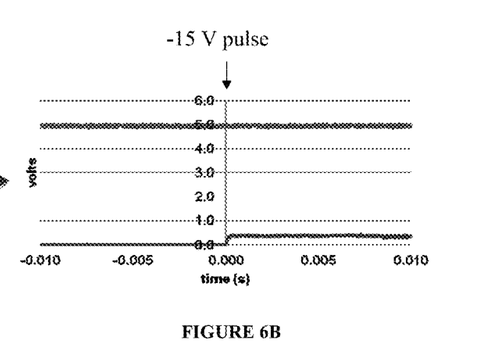

FIGS. 6A and 6B show illustrative plots of the switching behavior of a layer of amorphous carbon having a thickness of about 20-30 Å. As shown in FIG. 6A, a −20 V pulse applied at t=0 can be used to switch a carbon layer that is initially conductive into a high resistance OFF state. As shown in FIG. 6B, a −15 V pulse applied at t=0 can be used to restore a conductive ON state to a carbon layer that is initially non-conductive.

In various embodiments, the switching layer can have a thickness ranging between about 100 Å and about 1000 Å. In some embodiments, the switching layer can have a thickness ranging between about 200 Å and about 800 Å, or between about 250 Å and about 750 Å, or between about 250 Å and about 500 Å, or between about 500 Å and about 750 Å, or between about 300 Å and about 500 Å, or between about 500 Å and about 700 Å.

The type, diameter, and length of carbon nanotubes located within the switching layer are not believed to be particularly limited. In various embodiments, the carbon nanotubes can be predominantly single-wall carbon nanotubes, double-wall carbon nanotubes, multi-wall carbon nanotubes, or any combination thereof. Further, the carbon nanotubes can be metallic, semimetallic, or semiconducting depending on their chirality and/or diameter. The carbon nanotubes located within the switching layer can be made by any known technique such as, for example, arc methods, laser oven synthesis, chemical vapor deposition, flame synthesis, and high pressure carbon monoxide (HiPC®). The carbon nanotubes can be in a variety of forms (e.g., soot, powder, fibers, "buckypapers," and the like), and they can be used in their raw, as-synthesized form, or they can be at least partially purified by a purification technique, if desired. In some embodiments, the carbon nanotubes can be present in a substantially debundled state (i.e., as individual carbon nanotubes). In other embodiments, the carbon nanotubes can be present as ropes or bundles of carbon nanotubes. In some embodiments, the carbon nanotubes can be directly grown on the electrical devices described herein.

In some embodiments, the carbon nanotubes can be present in the form of a carbon nanotube fabric. Illustrative techniques for placing carbon nanotube fabrics on a substrate are set forth in commonly owned U.S. Pat. No. 7,334,395, which is incorporated herein by reference in its entirety. In various embodiments, a non-woven carbon nanotube fabric can be grown over a substrate through use of a catalyst in a suitable carbon nanotube growth environment. In other various embodiments, a matted carbon nanotube layer (e.g., a buckypaper) can be formed separately and applied to a substrate. In still other various embodiments, a carbon nanotube fabric can be applied to a substrate by spin coating or spray coating a carbon nanotube solution or suspension, for example. Optionally, patterning can be performed once the carbon nanotubes have been placed on the substrate.

In some embodiments, the carbon nanotubes can be substantially free of defects other than those produced during the carbon nanotube synthesis. That is, the carbon nanotubes can be substantially undamaged during the process of constructing the electrical devices described herein. Specifically, in some embodiments, the carbon nanotubes can be substantially undamaged after the second metal contact is disposed on the passivation layer. In such embodiments, the passivation layer can have a thickness sufficient to eliminate or substantially eliminate damage to the carbon nanotubes.

In some embodiments of the electrical devices described herein, the switching layer can also contain at least some amorphous carbon in addition to carbon nanotubes. The presence of amorphous carbon in the switching layer is not believed to be detrimental to operation of the devices and can simplify their fabrication by not having to affect removal of the carbon. If desired, in some embodiments, the amorphous carbon can be at least partially removed from the switching layer post-fabrication by a suitable etching technique. Etching techniques that are suitable for removing amorphous carbon but not carbon nanotubes from the electrical devices will be familiar to one having ordinary skill in the art. One of ordinary skill in the art will further recognize that suitable etching techniques for removing amorphous carbon from the switching layer will also removal amorphous carbon from the passivation layer, thereby resulting in thinning of the passivation layer, which can be desirable in certain instances. In some embodiments, suitable etching techniques can include low temperature exposure to an oxidizing atmosphere. For example, at about 400° C., amorphous carbon is converted to CO, whereas carbon nanotubes are converted at about 600° C. In some embodiments, suitable etching techniques can include $H_2$ reactive ion exposure, which can sometimes be used to selectively etch amorphous carbon.

Figure 7:
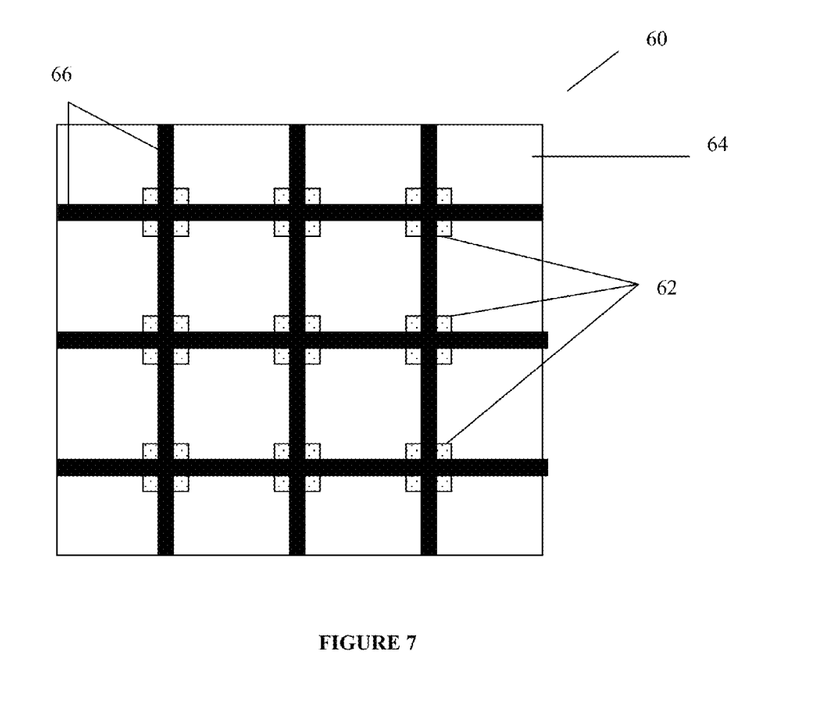
FIG. 7 shows a top view schematic of an illustrative crossbar array of electrical devices.

In some embodiments, arrays of the electrical devices described herein can be constructed. In some embodiments, the electrical device arrays can be in the form of a crossbar array. FIG. 7 shows a top view schematic of an illustrative crossbar array of electrical devices. As shown in FIG. 7, array 60 contains a plurality of electrical devices 62 disposed on substrate 64. The top metal contacts of electrical devices 62 are evident in FIG. 7, and the remaining layers thereof extend into the plane of substrate 64. Crossbar metal contacts 66 can be used to supply electrical current to electrical devices 62 in order to turn each device into a desired ON or OFF state. Although FIG. 7 has depicted a 3×3 electrical device array, it is to be recognized that any size of electrical device array can be constructed. Other types of electrical device arrays other than a crossbar architecture can also be envisioned by one having ordinary skill in the art.

In some embodiments, methods for forming the electrical devices of the present disclosure are described herein. In some embodiments, methods for forming the electrical devices can include forming a first metal contact in union with a dielectric substrate, disposing a switching layer containing a plurality of carbon nanotubes on the first metal contact, disposing a passivation layer containing amorphous carbon on at least a top surface of the switching layer, and forming a second metal contact on the passivation layer, thereby producing an electrical device.

Patterning of the switching layer, the passivation layer, and the second metal contact can be performed at various points throughout the methods for making the electrical devices. In some embodiments, the methods can further include patterning the switching layer, the passivation layer, and the second metal contact, after forming the second metal contact. In other embodiments, the methods can further include patterning the switching layer, before disposing the passivation layer thereon. When patterning is performed at this time, the passivation layer can also overcoat the sides of the switching layer. In some embodiments, after patterning, the methods can further include overcoating the second metal contact with at least one dielectric material, thereby burying the switching layer and the passivation layer in the at least one dielectric material, and removing at least a portion of the at least one dielectric material so as to expose the second metal contact. Further details of the foregoing methods for forming and patterning the electrical devices follows below. Illustrative techniques for patterning of electrical devices of the present disclosure will be familiar to one having ordinary skill in the art and can include, for example, plasma etching, chemical etching, reactive ion etching, laser etching, thermal etching, wet etching and the like.

In some embodiments, at least the second metal contact can be deposited by sputtering techniques. Illustrative conditions for depositing a metal can include a DC power of about 1000 W to about 4000 W, a RF power of about 2000 W to about 3000 W, a pressure of about 1 mtorr to about 50 mTorr, and a gas flow rate of about 25 sccm to about 100 sccm.

In some embodiments, the methods can further include annealing the electrical devices. Advantages of annealing the electrical devices can include lowering the resistance of the switching layer, for example. For example, suitable annealing conditions for the electrical devices can include heating the electrical devices at a temperature of about 700° C. or more for about 1 minute or more. In some embodiments, annealing can be conducted under reduced pressure or an inert atmosphere. Annealing under the foregoing conditions can convert at least a portion of the amorphous carbon into a nanocrystalline carbon form. In some embodiments, the methods can include annealing the electrical devices after forming the second metal contact. Annealing at this point in time can at least partially convert the amorphous carbon in the passivation layer into a metal carbide, since the passivation layer and the second metal contact are in union with one another. Under the annealing conditions, the amorphous carbon in the passivation layer and the metal in the second metal contact can at least partially react to form the metal carbide. In some embodiments, the passivation layer can be completely reacted to form a metal carbide after annealing. In other embodiments, the passivation layer can contain both a metal carbide and carbon after annealing, where the carbon can be amorphous carbon, nanocrystalline carbon, or any combination thereof.

Suitable techniques for disposing a passivation layer containing amorphous carbon can include, for example, sputter deposition or chemical vapor deposition. Illustrative conditions for depositing an amorphous carbon film suitable for use in the present embodiments using sputter deposition techniques can include, for example, a deposition power of about 10 W to about 50 W, a deposition temperature of about 100° C. to about 200° C., a pressure of about 0.5 torr to about 10 torr, and a deposition time of about 2 seconds to about 20 seconds.

Figure 8:
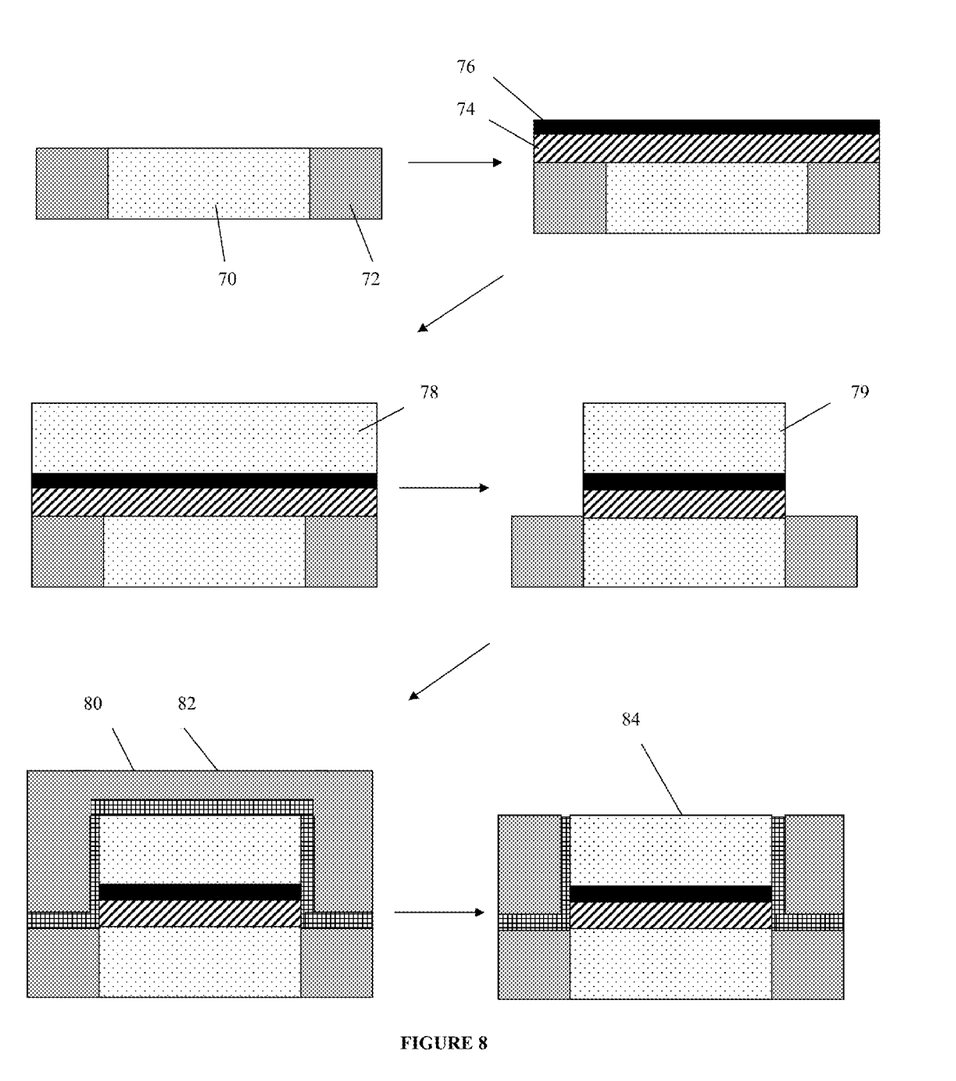
FIGS. 8 and 9 schematically depict illustrative processes for producing the electrical devices described herein, in which patterning takes place after deposition of the second metal contact.
Figure 9:
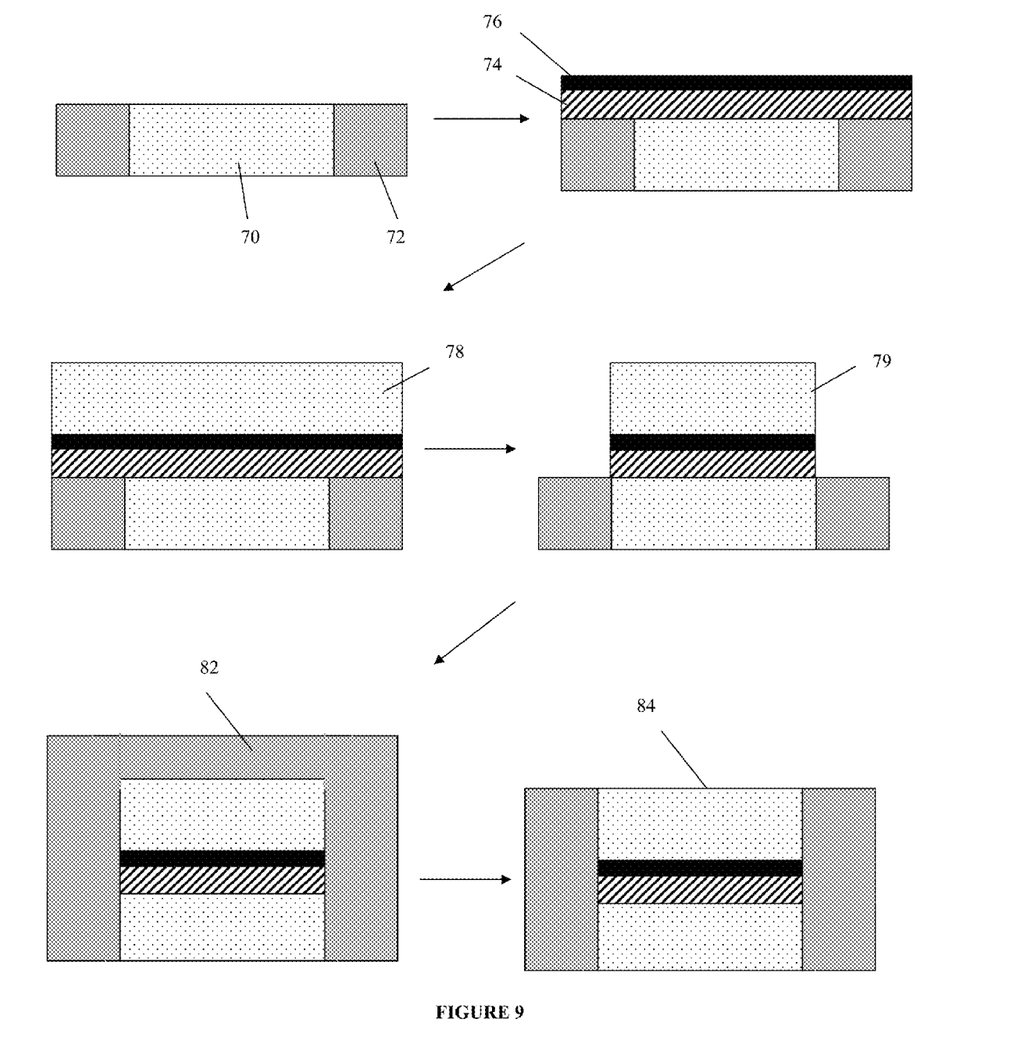

FIGS. 8 and 9 schematically depict illustrative processes for producing the electrical devices described herein, in which patterning takes place after deposition of the second metal contact. Starting from first metal contact 70 disposed in dielectric substrate 72, switching layer 74 and passivation layer 76 are sequentially deposited thereon. As described above, switching layer 74 contains carbon nanotubes, and passivation layer 76 contains at least some amorphous carbon. Next, metal layer 78 is deposited on passivation layer 76. Patterning of metal layer 78, passivation layer 76, and switching layer 74 is then conducted to define second metal contact 79. Following patterning to define second metal contact 79, one or more dielectric materials can be disposed thereon to bury all the layers. As depicted in FIG. 8, first dielectric material 80 (e.g., silicon nitride) can be deposited as a thin layer, with a thicker layer of second dielectric material 82 (e.g., silicon dioxide) being deposited thereon. In some instances, first dielectric material 80 can be omitted, and second dielectric material 82 alone can be used to overcoat the electrical devices. FIG. 9 shows such an embodiment, with first dielectric material 80 being omitted. Following deposition of the dielectric material(s), planarization can be conducted to expose the top surface 84 of second metal contact 79. At this point, first metal contact 70 and second metal contact 79 are ready for being electrically connected to a potential. For example, in some embodiments, a plurality of the electrical devices can be electrically connected to one another to form an electrical device array, such as array 60 depicted in FIG. 7.

Figure 10:
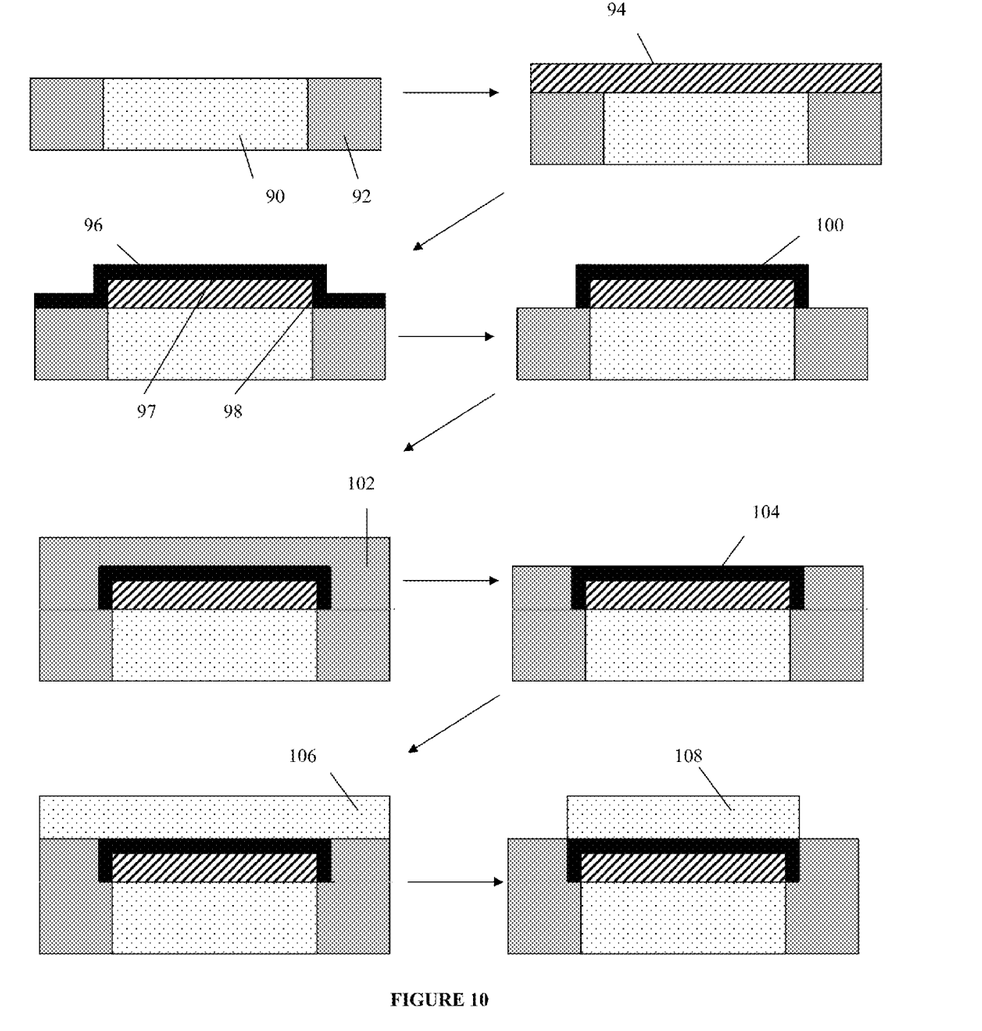
FIG. 10 schematically depicts an illustrative process for producing the electrical devices described herein, in which patterning takes place after deposition of the switching layer but before deposition of the passivation layer and the second metal contact.

FIG. 10 schematically depicts an illustrative process for producing the electrical devices described herein, in which patterning takes place after deposition of the switching layer but before deposition of the passivation layer and the second metal contact. As in FIGS. 8 and 9, starting from first metal contact 90 disposed in dielectric substrate 92, switching layer 94 is deposited thereon and then patterned. Thereafter, passivation layer 96 is deposited on switching layer 94, such that passivation layer 96 contacts both top surface 97 and side surface 98 of switching layer 94. Patterning of passivation layer 96 can then be conducted to re-expose dielectric substrate 92 and produce patterned passivation layer 100. Next, dielectric material(s) 102 can be deposited on patterned passivation layer 100, followed by planarization to expose top surface 104 of patterned passivation layer 100. Metal layer 106 can next be deposited, followed by patterning to define second metal contact 108 that is in union with patterned passivation layer 100. Although not shown, second metal contact 108 can optionally be overcoated by another deposition of dielectric material(s), followed by planarization, as depicted in FIGS. 8 and 9, if it is desired that second metal contact 108 be disposed therein.

Figure 11:
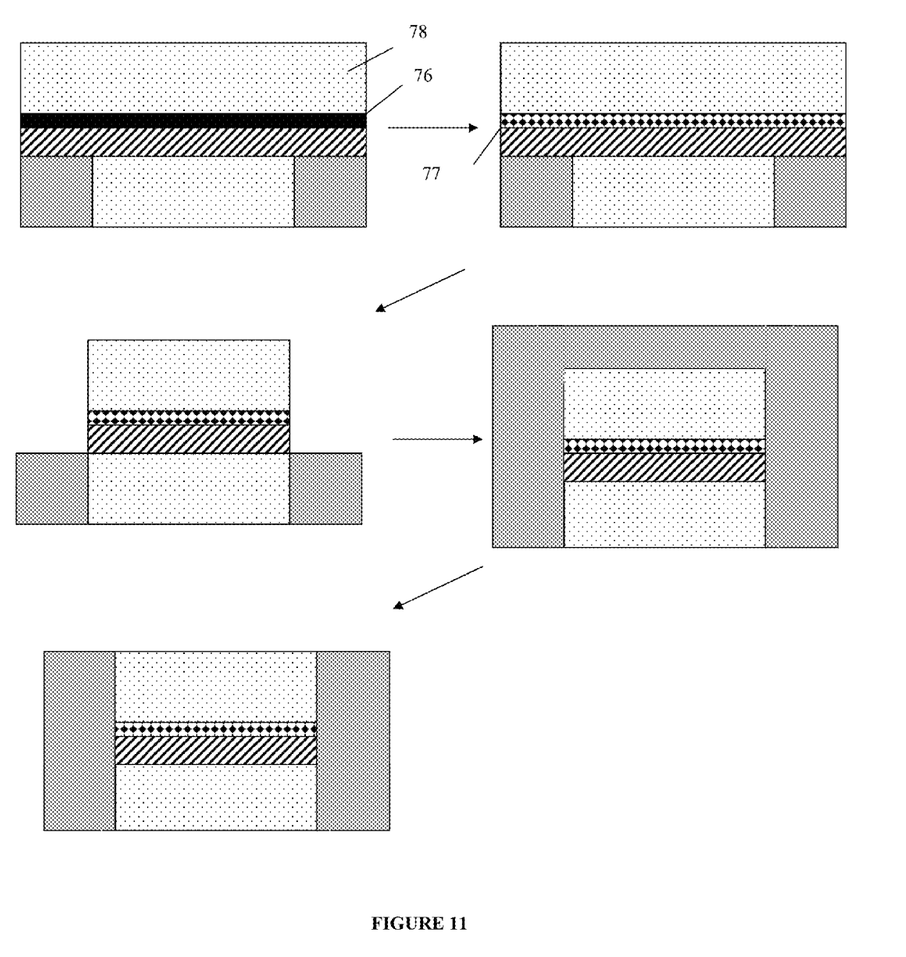
FIG. 11 schematically depicts an illustrative process for producing the electrical devices described herein, in which an optional annealing operation is performed during fabrication of the devices in order to at least partially transform the amorphous carbon in the passivation layer into a metal carbide.

FIG. 11 schematically depicts an illustrative process for producing the electrical devices described herein, in which an optional annealing operation is performed during fabrication of the devices in order to at least partially transform the amorphous carbon in the passivation layer into a metal carbide. In the process depicted in FIG. 11, an optional annealing operation has been added to the process depicted in FIG. 9, after deposition of metal layer 78. Annealing at least partially converts passivation layer 76 containing amorphous carbon into passivation layer 77 containing a metal carbide. The remaining operations of FIG. 11 mirror those of FIG. 9. It is to be recognized that annealing can be conducted for any of the electrical devices described herein, not just for the illustrative embodiment illustrated in FIG. 11. Further, it is to be recognized that annealing to produce a metal carbide can take place at any stage after metal layer deposition on the switching layer occurs. That is, annealing need not necessarily take place before patterning is conducted.

It is understood that modifications which do not substantially affect the activity of the various embodiments of this invention are also included within the definition of the invention provided herein. Although the invention has been described with reference to the disclosed embodiments, one having ordinary skill in the art will readily appreciate that these embodiments are only illustrative of the invention. It should be understood that various modifications can be made without departing from the spirit of the invention. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range is specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is the following:

1. An electrical device comprising:
a first metal contact and a second metal contact;
a switching layer comprising a plurality of carbon nanotubes disposed between the first metal contact and the second metal contact; and
a passivation layer comprising a metal carbide that is disposed on the switching layer;
wherein the switching layer is disposed on the first metal contact, and the second metal contact is disposed on the passivation layer.

2. The electrical device of claim 1, wherein the passivation layer further comprises amorphous carbon, nanocrystalline carbon, or any combination thereof.

3. The electrical device of claim 1, wherein the switching layer has a thickness ranging between about 250 Å and about 750 Å.

4. The electrical device of claim 1, wherein the passivation layer has a thickness ranging between about 10 Å and about 30 Å.

5. The electrical device of claim 1, wherein the switching layer has a switching voltage magnitude ranging between about 1 V and about 8 V, and the passivation layer has a switching voltage magnitude ranging between about 15 V and about 25 V.

6. The electrical device of claim 1, wherein the passivation layer is integral with the second metal contact by reacting amorphous carbon with the second metal contact.

7. An electrical device comprising:
a first metal contact;
a switching layer comprising a plurality of carbon nanotubes disposed on the first metal contact;

a passivation layer comprising a metal carbide disposed on a top surface of the switching layer; and a second metal contact disposed on the passivation layer.

8. The electrical device of claim 7, wherein the passivation layer is also disposed on the sides of the switching layer.

9. The electrical device of claim 7, wherein the first metal contact, the switching layer, the passivation layer, and the second metal contact are all disposed in a dielectric material.

10. The electrical device of claim 7, wherein the switching layer has a thickness ranging between about 250 Å and about 750 Å.

11. The electrical device of claim 7, wherein the passivation layer has a thickness ranging between about 10 Å and about 30 Å.

12. The electrical device of claim 7, wherein the switching layer has a switching voltage magnitude ranging between about 1 V and about 8 V, and the passivation layer has a switching voltage magnitude ranging between about 15 V and about 25 V.

13. The electrical device of claim 7, wherein the carbon nanotubes are substantially undamaged after the second metal contact is disposed on the passivation layer.

14. The electrical device of claim 7, wherein the switching layer further comprises at least some amorphous carbon.

15. The electrical device of claim 7, wherein the passivation layer is integral with the second metal contact by reacting amorphous carbon with the second metal contact.

* * * * *